(12) United States Patent
Negoro et al.

(10) Patent No.: US 7,292,051 B2
(45) Date of Patent: Nov. 6, 2007

(54) ELECTROSTATIC CAPACITANCE SENSOR AND FLAP TYPE HANDLE HAVING ELECTROSTATIC CAPACITANCE SENSOR

(75) Inventors: Kazuhiro Negoro, Kasugai (JP); Shoji Mafune, Nagoya (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 11/370,227

(22) Filed: Mar. 7, 2006

(65) Prior Publication Data
US 2006/0197540 A1  Sep. 7, 2006

(30) Foreign Application Priority Data
Mar. 7, 2005 (JP) .............................. 2005-062128

(51) Int. Cl.
*G01R 27/26* (2006.01)
*E05B 3/00* (2006.01)

(52) U.S. Cl. .................. 324/690; 324/660; 307/9.1; 307/10.1

(58) Field of Classification Search ............. 324/690, 324/660; 307/9.1–10.2
See application file for complete search history.

(56) References Cited

U.S. PATENT DOCUMENTS

| | | | |
|---|---|---|---|
| 6,429,782 B2 * | 8/2002 | Pavatich et al. | 340/686.6 |
| 6,825,752 B2 * | 11/2004 | Nahata et al. | 340/5.64 |
| 7,108,301 B2 * | 9/2006 | Louvel | 292/336.3 |
| 2004/0039511 A1 * | 2/2004 | Garnault et al. | 701/49 |
| 2004/0046449 A1 * | 3/2004 | Eidesheim et al. | 307/10.1 |
| 2004/0125545 A1 * | 7/2004 | Kobayashi et al. | 361/600 |
| 2005/0231364 A1 * | 10/2005 | Nitawaki et al. | 340/545.4 |

FOREIGN PATENT DOCUMENTS

| | | |
|---|---|---|
| JP | 2002-147117 | 5/2002 |
| JP | 2003-221948 | 8/2003 |
| JP | 2004-150869 | 5/2004 |

OTHER PUBLICATIONS

Patent Abstracts of Japan 2003-221948 dated Aug. 8, 2003, 2 pages.
Patent Abstracts of Japan 2004-150869 dated May 27, 2004, 1 page.
Patent Abstracts of Japan 2002-147117 dated May 22, 2002, 2 pages.

* cited by examiner

*Primary Examiner*—Walter Benson
*Assistant Examiner*—John Zhu
(74) *Attorney, Agent, or Firm*—Osha Liang LLP (57) ABSTRACT

A flap type handle equipped with an electrostatic capacitance sensor, in which sensitivity adjustment can be easily performed without changing the specification of a sensor body 3, reduces the difference in detection sensitivity with respect to the position and perform required balance adjustment. A sensor body is fixed to a handle base portion. The detection face of the sensor body is oriented to a predetermined detection range at the inner surface side of a hand flap. An electrically conductive face is provided to the inner surface of the handle flap so as to cover the detection range. A connecting electric conductor for electromagnetically couple the electrically conductive face and the detection electrode at least under the non-operation of the handle flap is provided. The connecting electric conductor or/and the electrically conductive face are subjected to detection sensitivity adjusting trimming (provided with a cut-out or the like).

9 Claims, 7 Drawing Sheets

ELECTROSTATIC CAPACITANCE SENSOR AND FLAP TYPE HANDLE HAVING ELECTROSTATIC CAPACITANCE SENSOR

BACKGROUND OF THE INVENTION

1. Field of the Invention

The present invention relates to an electrostatic capacitance sensor for detecting approach of a human body or the like, and a flap type handle having an electrostatic capacitance sensor containing the main body of the sensor.

2. Description of Related Art

An electrostatic capacitance sensor is installed in a door handle of a vehicle as disclosed in JP-A-2003-221948 (Patent Document 3), for example, and it is used as a sensor for detecting approach of a human body to the door handle by generating a trigger of a signal transmission to a portable device in a keyless entry system.

A conventional general electrostatic capacitance sensor is designed to be electromagnetically provided in the form of a single body as a sensor body, and it detects variation of electrostatic capacitance (floated capacitance) formed by a detection electrode of the sensor body and a detection target facing the detection electrode to detect the presence or absence of the detection target.

JP-A-2002-147117 (Patent Document 1) discloses an automatic door using an electrostatic capacitance sensor using an electrically conductive vapor-deposited film, electrically conductive print or the like as a detection electrode in order to enlarge the detection range of the sensor. Furthermore, JP-A-2004-150869 (Patent Document 2) discloses a proximity sensor for enhancing detection capability (detection range, etc.) by combining the detection portion of an electrostatic capacitance sensor with dielectric material (for example, cloth). However, the Patent Document 2 has no detailed description on how the dielectric material is combined.

In the case of the conventional general electrostatic capacitance sensor described above, the sensitivity adjustment (containing adjustment of sensitivity balance, setting of the detection range) is carried out by adjusting the electrode size or adjusting the gain of the detection circuit. However, in this construction, it is required to change the dimension and shape of the detection electrode and the gain of the detection circuit (set different optimal values) in accordance with applied conditions such as the dimension and shape of a fixing portion of the sensor (for example, the dimension and shape of the door handle), required sensitivity, etc., and this is problematic. When it is required to change the dimension and shape of the detection electrode in accordance with the applied condition, it is required to produce plural kinds of sensor main bodies in accordance with the applied condition, and this is disadvantageous in production cost, part managing cost. Furthermore, when the gain of the detection circuit is required to be changed in accordance with the applied condition, plural kinds of detection circuits in which different gains are set in advance are required to be produced in accordance with the applied condition, or it is required to carry out a work of adjusting the gain of the detection circuit at the fabrication time case by case. Therefore, this is disadvantageous in production cost, part managing cost.

In the case of the sensor disclosed in the Patent Document 2, by varying the size of the dielectric material (for example, cloth) combined with the detecting portion of the electrostatic capacitance sensor, the detection capability (the detection range, etc.) can be changed without changing the dimension and shape of the detection electrode of the sensor body. However, in this case, large difference in sensitivity occurs between the contact portion between the dielectric material and the sensor body (the overlap portion between the detection electrode of the sensor body and the dielectric material) and the portion of only the dielectric material, and it is difficult to equalize the sensitivity distribution as a whole (that is, the difference in detection sensitivity with respect to the position is reduced, the balance is adjusted to desired one), for example.

For example in the case where the sensor body is installed in a door handle or the like as disclosed in the Patent Document 3, if a gap (space) occurs between the inner surface of the member constituting the door handle or the like and the dielectric material or between the dielectric material and the detection face of the sensor body, foreign material invades into this gap and the detection sensitivity is varied.

Furthermore, there is no prior art in which an electrostatic capacitance sensor is installed in a flap type handle having a complicated construction, and it is a problem how to dispose the sensor body in the flap type handle and how to secure the performance such as the detection range, etc.

SUMMARY OF THE INVENTION

Therefore, the present invention has an object to provide an electrostatic capacitance sensor in which sensitivity adjustment can be easily performed without changing the specification of the sensor body, reduce the difference in sensitivity with respect to the position and perform required balance adjustment. Furthermore, the present invention has another object to provide an electrostatic capacitance sensor in which a problem caused by invasion of foreign material hardly occurs, and provide an excellent flap type handle using the electrostatic capacitance sensor of the presents invention.

According to an electrostatic capacitance sensor of this application, in an electrostatic capacitance sensor for detecting approach to a predetermined detection range of a dielectric material on the basis of variation of floated capacitance formed by a detection electrode provided to the sensor body, a detection face of the sensor body is oriented to face the detection range, and an electrically conductive face is provided so as to cover the detection range, a connecting electric conductor for electromagnetically coupling the electrically conductive face and the detection electrode at least at the detection time, and the connecting electric conductor or/and the electrically conductive face are subjected to trimming for adjusting the detection sensitivity.

Here, the "floated capacitance" is capacitance (capacitance to the ground) constructed by a human body as a detection target and the detection electrode.

Furthermore, the "electromagnetically coupling" means that the coupling is carried out so that the electrically conductive face functions as an expanded detection electrode out of the sensor body. For example, if at least a part of the connecting electric conductor is disposed so as to be confronted to and overlapped with the detection electrode of the sensor body, and a part of the connecting electric conductor is brought into contact with the electrically conductive face and conducted, the electrical conductive face functions as the expanded detection electrode out of the sensor body.

The "trimming" means partial cut-out, for example, provision of notch, opening, recess portion or the like.

The "electrically conductive face" can be constructed by subjecting the surface of the member covering the detection range (at least the surface at the detection range side) to surface treatment such as plating, conductive coating, deposition, sputtering or the like to form an electrically conductive layer. Furthermore, the "electrically conductive face" may be constructed by an electrically conductive member (for example, electrically conductive sponge or the like) provided so as to cover the detection range. Or, the "electrically conductive face" may be formed on the surface of a resin member covering the detection range by resin molding (for example, coinjection molding, IVONDING, IMD or the like). IVONDING is a circuit forming method using hot stamping. This is one kind of MID (Molded Interconnect Device) and it is a method of forming a circuit on a resin molded article by using no plating. IMD (Injection Moulding Decoration) means general insert molding, and contains a method of using super high pressure molding as preliminary molding.

Furthermore, "the electrically conductive face" may be constructed by an electrically conductive member integral with the "connecting electric conductor".

According to the electrostatic capacitance sensor of this application, by changing the size of the electrically conductive face, the detection range can be set to the desired breadth corresponding to the applied condition without changing the specification of the sensor body. Therefore, the sensor body can be commoditized, and the part production cost and the part managing cost can be greatly reduced. Furthermore, by increasing the size of the electrically conductive face, the detection range can be remarkably enlarged as compared with the detection range of the single body of the sensor body. Therefore, the sensor body can be miniaturized, and the space in which the sensor body is accommodated can be remarkably reduced. Furthermore, even when the shape of the fixing place of the sensor body is complicated, a desired detection range can be sufficiently broadly secured with suffering no restriction. The connecting electric conductor or/and the electrically conductive face are subjected to trimming for adjusting detection sensitivity, and thus there is an advantage that the difference in detection sensitivity with respect to the position can be reduced and required balance adjustment can be performed.

Next, according to a handle of this application, in a flap type handle with an electrostatic capacitance sensor that has a flap type handle body including a hand flap constructed so that a human hand is inserted to the inner surface side thereof and operated to pull the hand flap and the hand flap is fixed to a handle base portion so as to be operable in the pull direction, the handle body being equipped with a sensor body of the electrostatic capacitance sensor for detecting approach of a dielectric material on the basis of variation of floated capacitance constructed by a detection electrode provided to the sensor body to detect the human hand, the sensor body is secured to the handle base portion, the detection face of the sensor body is oriented to face a predetermined detection range at the inner surface side of the handle flap, an electrically conductive face is provided to the inner surface of the handle flap so as to cover the detection range, a connecting electric conductor for electromagnetically coupling the electrical conductive face and the detection electrode at least under the non-operation of the hand flap (that is, at the detection time) is provided, and the connecting electric conductor or/and the electrically conductive face are subjected to trimming for adjusting detection sensitivity. The electromagnetic coupling by the connecting electric conductor may be implemented by the following construction. That is, at least when the handle flap is under non-operation, the connecting electric conductor is set to a conduction state (contact state or the like) to the electrically conductive face, and also at least a part thereof is disposed so as to be overlapped and confronted to the detection electrode, whereby the electrically conductive face and the detection electrode can be electromagnetically coupled to each other.

According to the handle of the present invention, by changing the size of the electrically conductive face, the detection range can be set to a desired breadth (prescribed breadth at the inside of the handle flap) corresponding to an applied condition without changing the specification of the sensor body. Therefore, the sensor body can be commoditized, and the part production cost and the part managing cost can be greatly reduced. Furthermore, by increasing the size of the electrically conductive face, the detection range can be remarkably enlarged as compared with the detection range of the single body of the sensor body. Therefore, the sensor body can be miniaturized, and the space in which the sensor body is accommodated can be remarkably reduced. Furthermore, even when the shapes of the handle base portion and the handle flap (that is, the shape of the fixing place of the sensor body) are complicated, the required detection range can be sufficiently broadly secured with no restriction. Furthermore, the connecting electric conductor or/and the electrically conductive face are subjected to trimming for adjusting the detection sensitivity of the electrostatic capacitance sensor, and thus there is an advantage that the difference in detection sensitivity with respect to the position can be reduced, and the required balance adjustment can be performed.

Furthermore, in the handle of this application, the sensor body is fixed to the handle base portion (fixed side). Therefore, as compared with a case where it is fixed to the handle flap (movable side), wiring to the sensor body can be remarkably facilitated. Furthermore, if the sensor body is secured in the handle flap, it is difficult to insert a hand, however, such a problem does not occur in this application.

According to a preferred embodiment of the handle of this application, the connecting electric conductor is formed of a material having a characteristic that it has elasticity or plasticity and is deformed in accordance with the shape of the bonded face and brought into close contact with the bonded face (for example, electrically conductive sponge, electrically conductive rubber, electrically conductive elastomer), and it is pinched between the detection face of the sensor body and the handle flap under the non-operation of the handle flap.

In this embodiment, a buffer effect based on the connecting electric conductor is achieved, and also no gap in which foreign material invades occurs between the detection face of the sensor body and the handle flap at least under the non-operation of the handle flap. Therefore, the reduction in performance of the electrostatic capacitance sensor due to invasion of the foreign material and the probability of occurrence of malfunction, etc. can be remarkably suppressed, and unstable factors such as contamination of dust, variation of humidity, etc. can be eliminated. Furthermore, the probability of occurrence of non-uniformity of the detection range due to the gap is reduced. Accordingly, an electrostatic capacitance sensor having high sensitivity and high safety can be provided although it is a flap type handle having a complicated structure.

According to the electrostatic capacitance sensor of this application, by changing the size of the electrically conductive face, the detection range can be set to the required breadth corresponding to the applied condition without changing the specification of the sensor body. Therefore, the sensor body can be commoditized, and the part production cost and the part management cost can be greatly reduced. By increasing the electrically conductive face, the detection range can be more remarkably enlarged as compared with the detection range of the single body of the sensor body. Therefore, the sensor body can be miniaturized, and the space in which the sensor body is accommodated can be remarkably reduced. Furthermore, even when the shape of the fixing place of the sensor body is complicated, the required detection range can be sufficiently broadly secured with no restriction. Furthermore, the connecting electric conductor or/and the electrically conductive face is subjected to trimming for adjusting the detection sensitivity, and thus there is an advantage that the difference in detection sensitivity with respect to the position can be reduced, and the required balance adjustment can be performed.

According to the handle of this application, by changing the size of the electrically conductive face, the detection range can be set to the required bread (the prescribed breadth at the inside of the handle flap) corresponding to the applied condition without changing the specification of the sensor body. Therefore, the sensor body can be commoditized, and the part production cost and the part managing cost can be greatly reduced. Furthermore, by increasing the electrically conductive face, the detection range can be more remarkably enlarged as compared with the detection range of the single body of the sensor body (for example, the whole detection range in the handle flap can be sufficiently broadly set). Therefore, the sensor body can be miniaturized and the space in which the sensor body is accommodated can be remarkably reduced. Furthermore, even when the shapes of the handle base portion and the handle flap (that is, the shape of the fixing place of the sensor body) are complicated, the required detection range can be sufficiently broadly secured with no restriction. Furthermore, the connecting electric conductor or/and the electrically conductive face is subjected to trimming for adjusting the detection sensitivity, and thus there is an advantage that the difference in detection sensitivity with respect to the position can be reduced, and the required balance adjustment can be performed.

In the handle of this application, the sensor body is fixed to the handle base portion (fixed side). Therefore, as compared with the sensor body is secured to the handle flap (movable side), the wiring to the sensor body can be more remarkably facilitated. Furthermore, if the sensor body is secured in the handle flap, it is difficult to insert a hand, however, such a problem does not occur in this application.

DESCRIPTION OF PREFERRED EMBODIMENTS

Embodiments of the present invention will be described with reference to the drawings.

First Embodiment

First, a first embodiment will be described. This embodiment relates to a flap type door handle (outer handle) of a vehicle in which an electrostatic capacitance sensor for detecting approach of a human body or the like (dielectric material) is installed.

Figure 1A:
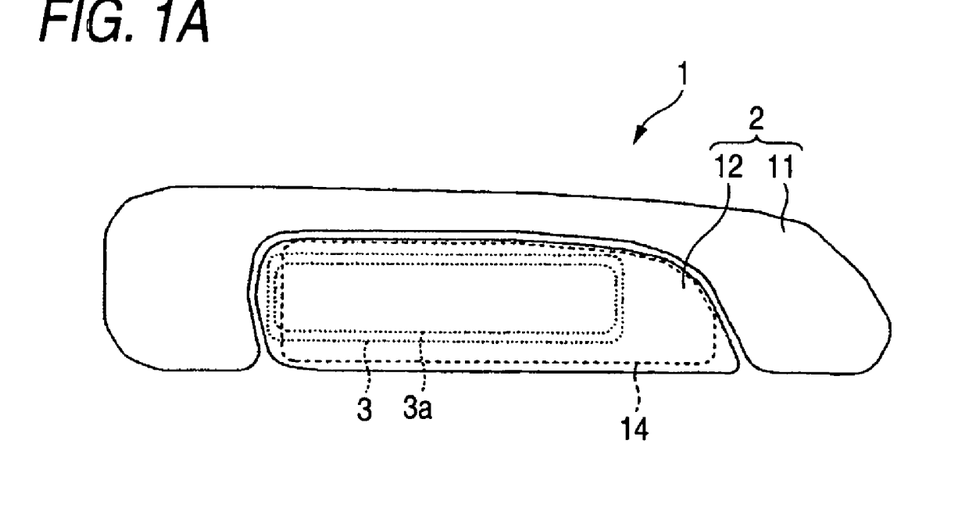
FIG. 1A is a diagram showing the front side of a door handle (first embodiment)
Figure 1B:
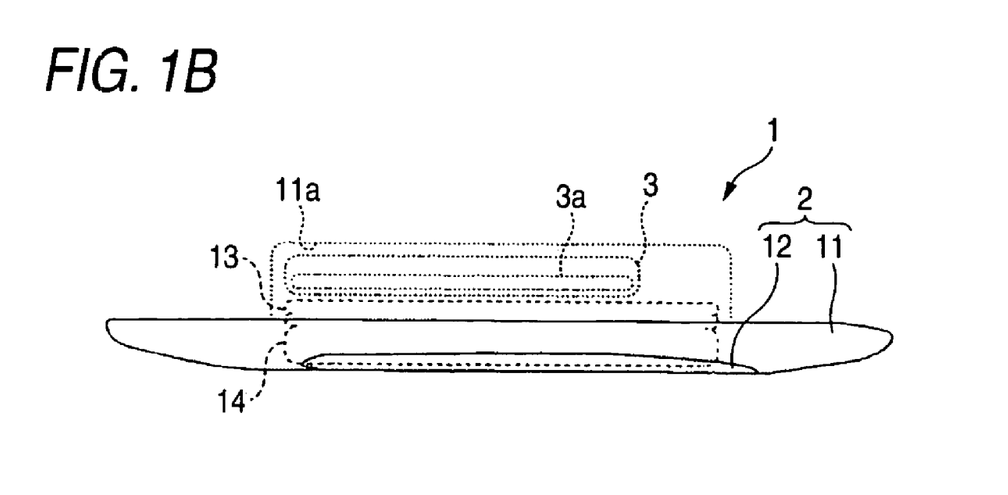
FIG. 1B is a plan view showing the upper surface side of the door handle (first embodiment).
Figure 2A:
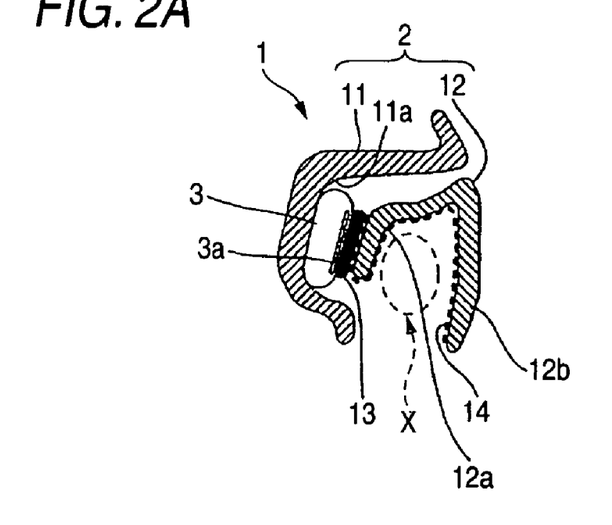
FIG. 2A is a longitudinally-sectional view showing the internal construction of the door handle (first embodiment)
Figure 2B:
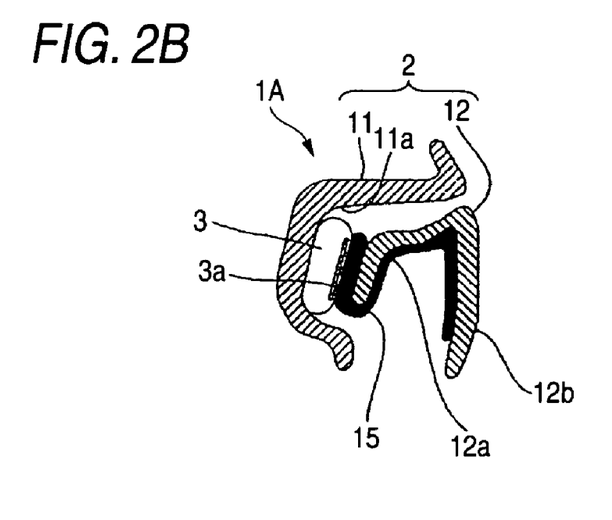
FIG. 2B is a longitudinally-sectional view showing the internal construction of the door handle (second embodiment)
Figure 2C:
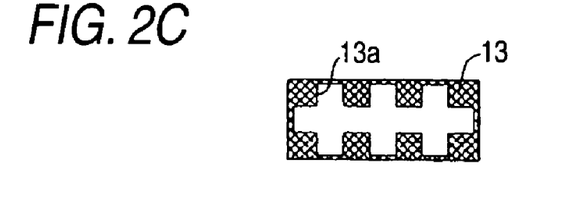
FIG. 2C is a diagram showing a trimming shape.

FIG. 1A is a diagram showing a front side of a door handle 1 of this embodiment (a perspective view of the sensor body 3, etc.), FIG. 1B is a plan view showing the upper surface side of the door handle 1 (a perspective view of the sensor body 3, etc.), FIG. 2A is a longitudinally-sectional view showing the internal structure of the door handle 1, and FIG. 2C is a diagram showing a trimming shape.

In the door handle 1, the sensor body 3 of the electrostatic capacitance sensor is provided in the door handle body 2.

Here, the door handle body 2 comprises a handle base portion 11 formed of synthetic resin, for example, and a handle flap 12. The handle base portion 11 is a member fixed to a door of a vehicle, and has a recess portion 11a to which the handle flap 12 is secured. The handle flap 12 is a member having a mountain shape in section and designed to has a rear side plate portion 12a disposed in the recess portion 11a and a front side plate portion 12b expanding from the upper end of the rear side plate portion 12a downwardly at the front surface side as shown in FIG. 2A, and it is secured to the handle base portion 11 so as to be swingable in the pull-up direction (the detailed description on this fixing structure, etc. is omitted). A user inserts his/her hand to the inside of the handle flap 12 (the back side of the front side plate portion 12b) and pulls up the handle flap 12 to open the door.

The sensor body 3 is the body of the electrostatic capacitance sensor (containing at least a sensor head), and contains a detection electrode 3a. Here, any system may be adopted for the electrostatic capacitance sensor insofar as it detects a dielectric material such as a human body or the like on the basis of variation of the floated capacitance constructed by the detection electrode. For example, it may comprise a charge transfer type detecting circuit. Furthermore, a differential correcting comparison electrode may be equipped to the back side of the detection electrode 3a. Furthermore, the detection circuit my be provided to the outside of the door handle 1 separately from the sensor body 3, for example, however, it may be contained in the door handle 1 (out of the sensor body 3) or in the sensor body 3. In this case, the sensor body 3 is secured to the inner surface of the recess portion 11a of the handle base portion 11 (the back side of the rear side plate portion 12a) as shown in FIG. 2A, and the detection face thereof is oriented in a slightly obliquely downward direction to the front surface side (the handle flap 12 side in order to detect the hand of the user inserted into the inside of the handle flap 12.

In the cross-section shown in FIG. 2A, a sheet-shaped connecting electric conductor 13 is provided between the detection face of the sensor body 3 and the rear side plate portion 12a of the handle flap 12. Furthermore, an electrically conductive face 14 formed of a metal-plated layer is formed over a position range extending from the back side surface of the rear side plate portion 12a of the handle flap 12 to the inner surface and further extending to the inner surface of the front side plate portion 12b of the handle flap 12. The electrically conductive face 14 is not limited to plating, and it may be formed by a surface treatment such as conductive coating, deposition, sputtering or the like, or resin molding (for example, coinjection molding, IVOND-ING, IMD or the like).

Here, the electrically conductive face 14 is formed on the inner surface of the handle flap 12 (the rear side plate portion 12a and the front side plate portion 12b) so as to cover a required detection range (substantially the whole in the handle flap 12), and further continuously formed to the surface of the back side of the rear side plate portion 12a of the handle flap 12 (the portion in contact with the connecting electric conductor 13) so as to be electrically conducted to the connection electric conductor 13.

Furthermore, the connecting electric conductor 13 is disposed so as to be overlapped with and confronted to the detection electrode 3a of the sensor body 3, and one surface thereof is brought into contact with the detection surface of the sensor body 3 under the non-operation state of the handle flap (when the handle flap 12 is not pulled up) while the other surface is brought into contact with the back side surface of the rear side plate portion 12a (the portion at which the electrically conductive face 14 is formed, that is, the connecting electric conductor 13 is sandwiched between the detection face of the sensor body 3 and the handle flap 12.

The electrically conductive face 14 has such a breadth that the detection range of the electrostatic capacitance sensor is enlarged in a required range by the electrically conductive face 14. That is, in this case, the electrically conductive face 14 is formed in the positional range from the detection face of the sensor body 3 to the inner surface of the front side plate portion 12b of the handle flap 12. Furthermore, as shown in FIGS. 1A and 1B, the size in the right and left direction of the electrically conductive face 14 is set to be remarkably longer than that of the sensor body 3. Therefore, the detection range which would be limited to only the neighborhood of the detection face of the sensor body 3 if the electrically conductive face 14 is not provided is enlarged frontward to the neighborhood of the front side plate portion 12b of the handle flap 12, and also enlarged in the right and left direction, so that at the door handle 1, the whole portion to which the hand of a human who is about to open the door approaches is set to the detection range. The principle that the detection range is enlarged as described above is described in the Patent Document 2, and this is because dielectric potential occurring in the electrically conductive face 14 due to approach or contact of dielectric material is detected as variation of the electrostatic capacitance of the sensor body 3.

The connecting electric conductor 13 is formed of material having electrical conductivity and elasticity or plasticity, and more preferably it is formed of material which can be easily cut. Specifically, it is formed of electrically conductive sponge. The electrically conductive sponge is achieved by providing synthetic resin (polymer compound) sponge with electrical conductivity, and it generally has great elasticity and plasticity with which it is permanently set by long-term deformation, that is, it easily fits in the shape of a partner (it is deformed in conformity with the shape of the bonded surface and closely adheres to the bonded surface). It is used as a terminal protecting member of IC (a member for preventing damage by static electricity) or the like.

In order to provide electrical conductivity to polymer compound that is constructed by covalent bond of atoms and has no electrical conductivity, there is known a first method of mixing (doping) polymer compound having conjugated double bond (a raw material having some degree of electrical conductivity) with iodine, arsenic pentafluoride or the like to promote ionization based on delocalization of charges, thereby enhancing the electrical conductivity. Furthermore, there is known a second method of adding or laminating electrical conductivity providing material. As the main electrical conductivity providing material or the method of providing electrical conductivity, metal, organic complex, carbon black, etc. are usable as the addition type, and electrically conductive coating material, metal vacuum-deposition, oxide deposition, plating, etc. are usable as the laminating type. The method of adding carbon black is most broadly used. In this embodiment, electrically conductive sponge added with carbon black is suitably used for the connecting electric conductor 13. Carbon black is achieved by imperfect combustion of compounds containing carbon such as hydrocarbon or the like, and it has been used from ancient days by the gross. Furthermore, carbon black can be effectively mixed into polymer raw materials by a method of impregnating polymer raw materials into liquid dispersed with carbon black, a method of kneading carbon black into resin at the blend stage, etc.

For example, a cut-out (a portion which is cut out so as to penetrate in the thickness direction) or a recess portion is provided as a trimming for adjusting the detection sensitivity of the electrostatic capacitance sensor to at least a part of the connecting electric conductor 13 or/and the electrically conductive face 14 (particularly, a portion overlapped with the sensor body 3). For example, as shown in FIG. 2C, a cut-out 13a is formed in the connecting electric conductor 13. In this case, the trimming is used so that the relatively left side of the electrically conductive face 14 (a portion overlapped with the sensor body 3) and the right end side of the electrically conductive face (a portion which is not overlapped with the sensor body 3) are substantially equal to each other in detection sensitivity, and the detection sensitivity is substantially fixed over the whole in the right and left direction of the detection range. Or, it is used to prevent occurrence of the excessive difference in detection sensitivity between the rear side near to the sensor body 3 and the front side farther from the sensor body 3. The shape and dimension of the trimming such as the cut-out or the like is predetermined by experiments or the like in advance. For example, when the outer shape of the connecting electric conductor 13 is cut out from raw material of the connecting electric conductor 13 by a press machine or the like, the cut-out or the like may be simultaneously formed. Or, it may be provided by a well-known patterning technique when the electrical conductive layer serving as the electrically conductive face 14 is formed by plating or the like.

Figure 7A:
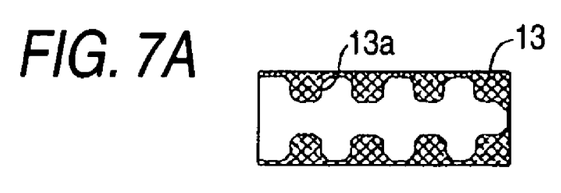
FIG. 7A to FIG. 7E are diagrams showing other examples of the trimming shape.
Figure 7B:
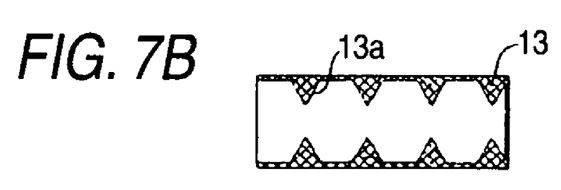
Figure 7C:
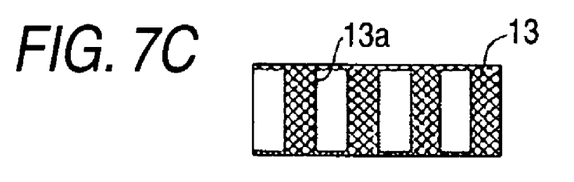
Figure 7D:
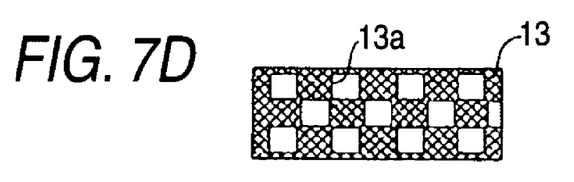
Figure 7E:
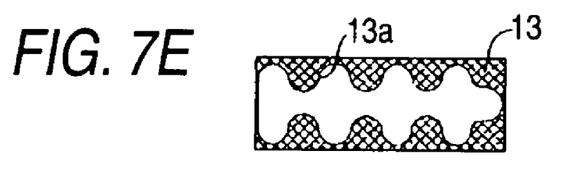

Here, the shape of the cut-out 13a as the trimming is not limited to a comb-shape shown in FIG. 2C, and it may be a ladder-like shape connected at the center portion thereof or a grid shape as shown in FIG. 7C or 7D. Furthermore, the corner portion may be chamfered as shown in FIG. 7A. Furthermore, the corner portion may be designed in a triangular shape as shown in FIG. 7B. Still furthermore, the cut-out is not limited to a linear cut-out, and it may be a curved cut out (for example, an arcuate shape) as shown in FIG. 7E. Charges are easily accumulated at the convex corner, and the dispersion in sensitivity can be suppressed by curving the corner portions.

When the same shape is repeated to construct the trimming shape, it is preferable that the repetitive pitch is finer as compared with a finger as a detection target. In JIS S 4700 "the ring size for jewelry", the minimum ring size is set to 41. This size represents the inner peripheral length of the ring by mm, and thus the width (diameter) of the finger is equal to about 13 mm. Accordingly, the repetitive pitch is preferably set to 6.5 mm or less.

The connecting electric conductor 13 of this embodiment may be secured to the detection face of the sensor body 3 or the surface at the back side of the front rear plate portion 12b of the handle flap 12 by adhesion or the like. When the connecting electric conductor 13 is fixed to the sensor body 3, the connecting electric conductor 13 is separated from the handle flap 12 (that is, the electrically conductive face 14) under the operation of the handle flap (when the handle flap 12 is pulled up). Furthermore, when the connecting electric conductor 13 is fixed to the handle flap 12, the connecting electric conductor 13 is separated from the sensor body 3 (that is, the detection electrode 3a) under the operation of the handle flap. Accordingly, at any rate, under the operation of the handle flap, there is a probability that the detection electrode 3a and the electrically conductive face 14 are not electromagnetically coupled to each other. However, under the operation of the handle flap, it is not required to carry out the detection because the user's hand has been already detected, and thus there is no problem.

In the case of the above-described door handle 1 having the electrostatic capacitance sensor according to this embodiment, the following effects can be achieved.

(1) By changing the size of the electrically conductive face 14, the detection range can be set to the required breadth corresponding to the applied condition without changing the specification of the sensor body 3. Therefore, the sensor body 3 can be commoditized, and the part production cost and the part managing cost can be greatly reduced.

(2) By providing the electrically conductive face 14, the sensor body 3 can be disposed at the back side of the handle flap 12 with properly securing the detection range. Therefore, there can be avoided such an obstruction that the sensor body 3 lies in the way and thus usability is lowered. For example, if the sensor body 3 is disposed at a position indicated by a character X in FIG. 2A, the detection range may be properly set without providing the electrically conductive face 14. However, in this case, there is a disadvantage that it is difficult for a user to insert his/her hand. However, according to this embodiment, the disadvantage as described above can be eliminated.

(3) By increasing the size of the electrically conductive face 14, the detection range can be more remarkably enlarged as compared with the detection range of the single body of the sensor body 3. Therefore, the sensor body can be more remarkably miniaturized as compared with the door handle 1 as shown in FIGS. 1A and 1B, and the space in which the sensor body 3 is accommodated can be remarkably reduced.

(4) the cut-out for adjusting the detection sensitivity of the electrostatic capacitance sensor or the like (not shown) is provided to the electrically conductive face 14 or/and the connecting electric conductor 13, so that the difference in detection sensitivity with respect to the position can be reduced and the required balance adjustment can be performed.

(5) Furthermore, in the handle 1 of this embodiment, the sensor body 3 is fixed to the handle base portion 11 (fixed side). Therefore, the wiring to the sensor body 3 can be more remarkably facilitated as compared with the case where the sensor body 3 is fixed to the handle flap 12 (movable side).

(6) The connecting electric conductor 13 is provided between the sensor body 13 and the rear side plate portion 12a of the handle flap 12, the connecting electric conductor 13 has a character of easily fitting in the shape of a partner and it is provided so as to be sandwiched between the sensor body 3 and the rear side plating portion 12a. Accordingly, the buffer effect can be achieved by the connecting electric conductor 13, and also no gap in which foreign material invades occurs at least between the detection face of the sensor body 3 and the rear side plate portion 12a at the normal time (under the non-operation of the handle flap). Therefore, the reduction of the performance of the electrostatic capacitance sensor due to invasion of foreign material and the probability of occurrence of the mal function can be remarkably suppressed, and unstable factors such as contamination of dust, humidity temperature, etc. can be eliminated. Furthermore, the probability of occurrence in non-uniformity of detection sensitivity due to the gap can be reduced. Accordingly, the flap type handle can be equipped with an electrostatic capacitance sensor having high sensitivity and high stability although the structure thereof is complicated.

Second Embodiment

Next, a second embodiment will be described. This embodiment is another embodiment of the flap type door handle (outer handle) (an embodiment in which the electrically conductive face and the connecting electric conductor are constructed as an integral member).

FIG. 2B is a longitudinally-sectional view showing the internal construction of the door handle 1A of this embodiment.

In the following description, the same constituent elements as the first embodiment are represented by the same reference numerals, and the duplicative description thereof is omitted.

In this embodiment, as shown in FIG. 2B, a sheet-shaped electric conductor 15 is disposed along the surface of the handle flap 12 in the positional range extending from the gap between the detection face of the sensor body 3 and the rear side plate portion 12a of the handle flap 12 to the inner surface of the front side plate portion 12b of the handle flap 12, and both the connecting electric conductor and the electrically conductive face are constructed by this electric conductor 15. The electric conductor 15 is formed of the same material as the connecting electric conductor 13 of the first embodiment (for example, electrically conductive sponge). A part of the electric conductor 15 is disposed so as to be overlapped with and confronted to the detection electrode 3a of the sensor body 3, and the detection range of the electrostatic capacitance sensor is enlarged to a required range by the electric conductor 15. That is, in this case, the electric conductor 15 is disposed from the detection face of the sensor body 3 to the inner surface of the front side plating portion 12b of the handle flap 12. Furthermore, the size in the right and left direction of the electric conductor 15 is set to be remarkably longer than the sensor body 3 as in the case of the electrically conductive face 14 of the first embodiment. Therefore, the detection range which would be limited to the neighborhood of the detection face of the sensor body 3 if there is no electric conductor 14, the detection range can be enlarged frontward to the neighborhood of the front side plate portion 12b of the handle flap 12, and also it is enlarged in the right and left direction. Therefore, at the door handle 1, the whole portion to which the hand of a human who is about to open the door approaches is set to the detection range.

The electric conductor 15 of this embodiment may be fixed to the handle flap 12 by adhesion or the like. When the handle flap is under operation, the electric conductor 15 is separated from the sensor body 3 (that is, the detection electrode 3a), however, no problem occurs as described above.

In the case of the above-described door handle 1A of this embodiment, in addition to the effect of the first embodiment, there is an effect that it is unnecessary to form the electrically conductive face by a treatment such as plating or the like.

Third Embodiment

Next, a third embodiment of the present invention will be described. This embodiment is another embodiment of the flap type door handle (outer handle) (an embodiment in which the connecting electric conductor is a thin film electric conductor).

Figure 3A:
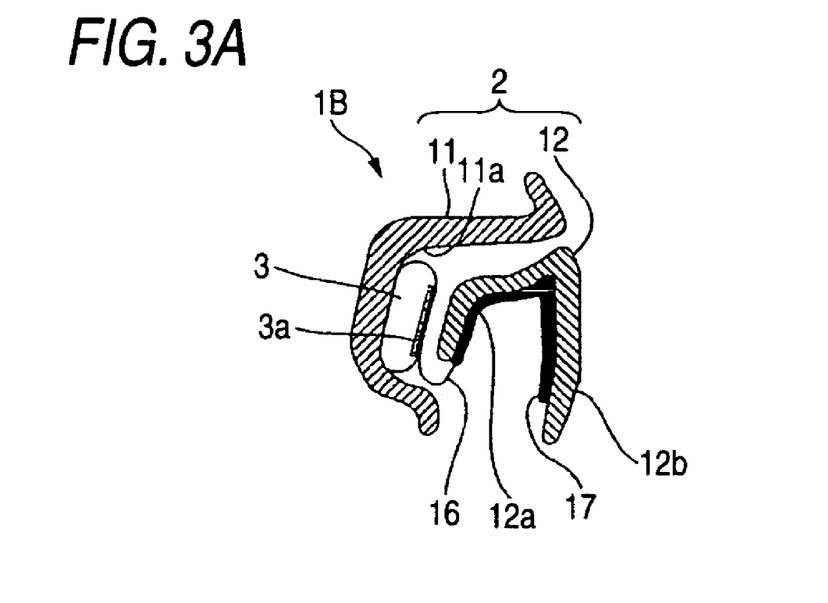
FIG. 3A is a longitudinally-sectional view showing the internal construction of the door handle (third embodiment)

FIG. 3A is a longitudinally-sectional view showing the internal construction of a door handle 1B of this embodiment.

In this embodiment as shown in FIG. 3A, an electrically conductive face is constructed by an electric conductor 17 fixed to the inner surface of the handle flap 12 by adhesion or the like. The electrically conductive face (electric conductor 17) and the detection electrode 3a are bonded to each other by a thin film connecting electric conductor 16. The connecting electric conductor 16 is formed of a thin film, and it is formed of an electrically conductive material having high elasticity (stretchable property or/and flexibility) or bendability. The connecting electric conductor 16 is disposed so that one end side thereof is overlapped with and confronted to the detection electrode 3a of the sensor body 3 at least under the non-operation of the handle flap, and the other end thereof is connected to the electric conductor 17 by welding or the like and conducted to the electric conductor 17. In this embodiment, the detection range of the electrostatic capacitance sensor is enlarged to the required range by the electric conductor 17 (electrically conductive face) and the connecting electric conductor 16 as in the case of the first embodiment.

This embodiment can also achieve the same effect as the first embodiment. However, a gap exists between the detection face of the sensor body 3 and the handle flap 12, and thus the first embodiment is more excellent than this embodiment in this sense.

Figure 4A:
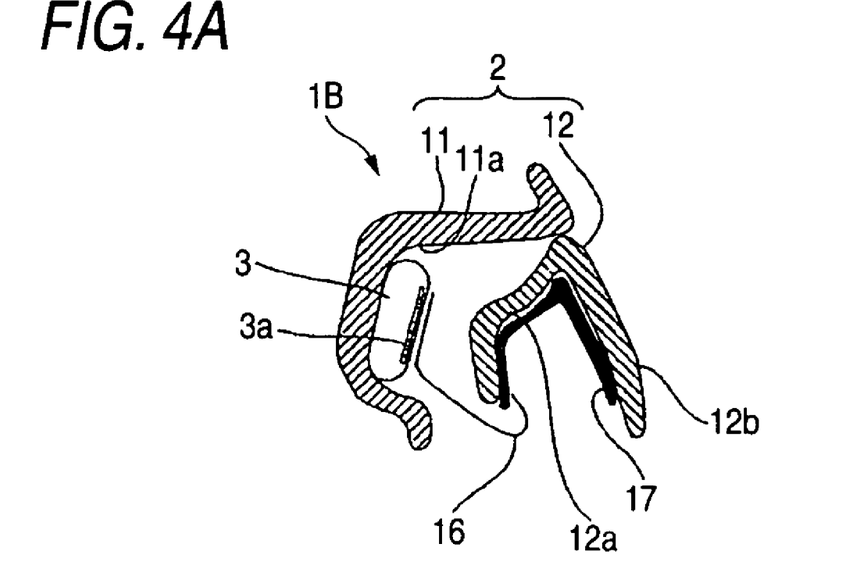
FIG. 4A is a diagram showing an example of the operating state of the door handle (third embodiment)
Figure 4B:
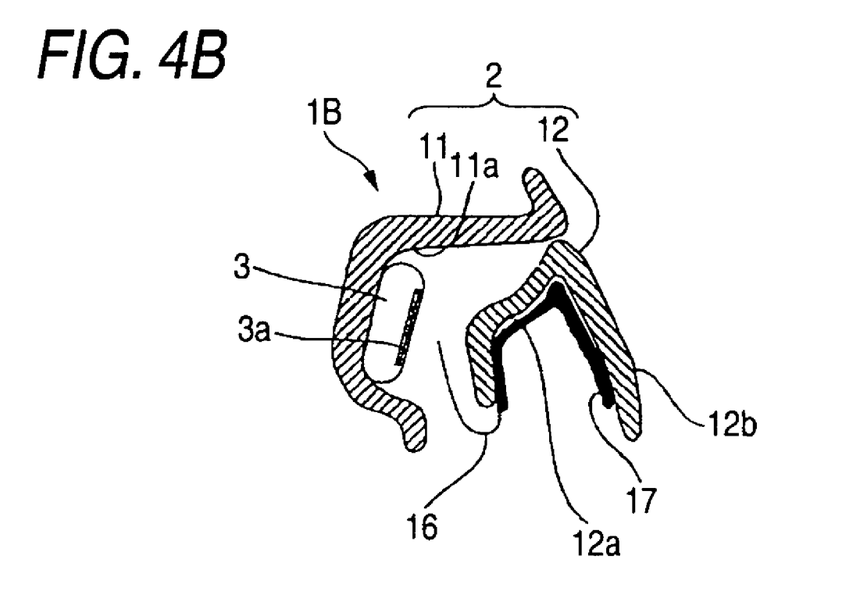
FIG. 4B is a diagram showing another example of the operating state of the door handle (third embodiment).

One end side of the connecting electric conductor 16 may be fixed to the detection face of the sensor body 3 by adhesion or the like, or it may not be fixed to the detection face. When one end side of the connecting electric conductor 16 is fixed to the sensor body 3, the connecting electric conductor 16 is required to be deformed as shown in FIG. 4A under the operation of the handle flap. Therefore, it is required to be provided with elasticity or bendability so that it can be easily stretched or bent. Furthermore, when one end side of the connecting electric conductor 16 is not fixed, the connecting electric conductor 16 is separated from the sensor body (that is, the detection electrode 3a) as shown in FIG. 4B under the operation of the handle flap. Therefore, even when the operation of the handle flap is repeated, it is required that one end side of the connecting electric conductor 16 is brought into close contact with the detection face of the sensor body 3 measurably under the non-operation of the handle flap. Specifically, it is required to pay attention to the design or the like so that the connecting electric conductor 16 is prevented from interfering with the handle base portion 11 and thus being deformed under the operation of the handle flap.

Fourth Embodiment

Next, a fourth embodiment will be described. This embodiment is also another embodiment of the flap type door handle (outer handle) (a modification of the embodiment in which the connecting electric conductor is a thin film electric conductor).

Figure 3B:
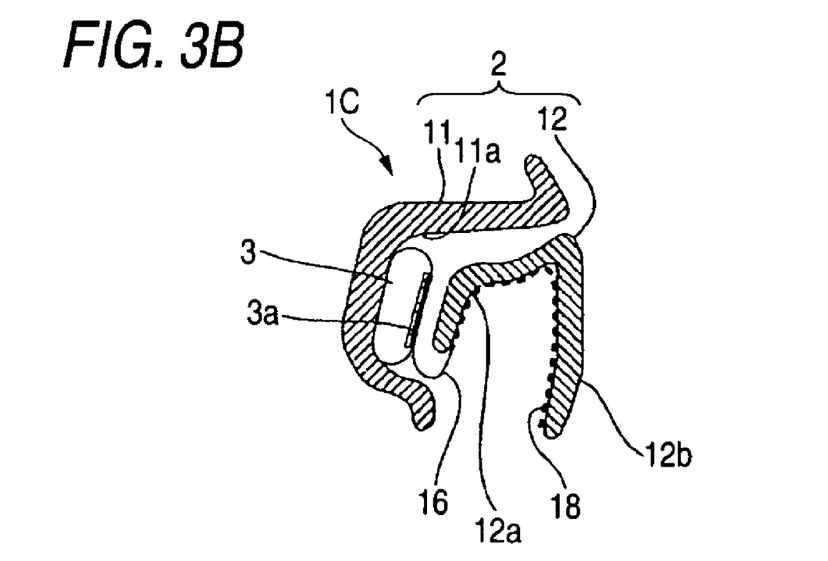
FIG. 3B is a longitudinally-sectional view showing the internal construction of the door handle (fourth embodiment).

FIG. 3B is a longitudinally-sectional view showing the internal construction of the door handle 1C of this embodiment.

In this embodiment, as shown in FIG. 3B, in place of the electric conductor 17 of the door handle 1B (FIG. 3A) of the third embodiment, an electrically conductive face 18 formed by plating or the like is provided. This embodiment can also achieve the same effect as the third embodiment.

Fifth Embodiment

Next, a fifth embodiment will be described. This embodiment is also another embodiment of the flap type door handle (outer handle) (another embodiment in which the electrically conductive face and the connecting electric conductor are constructed by an integral member).

Figure 5A:
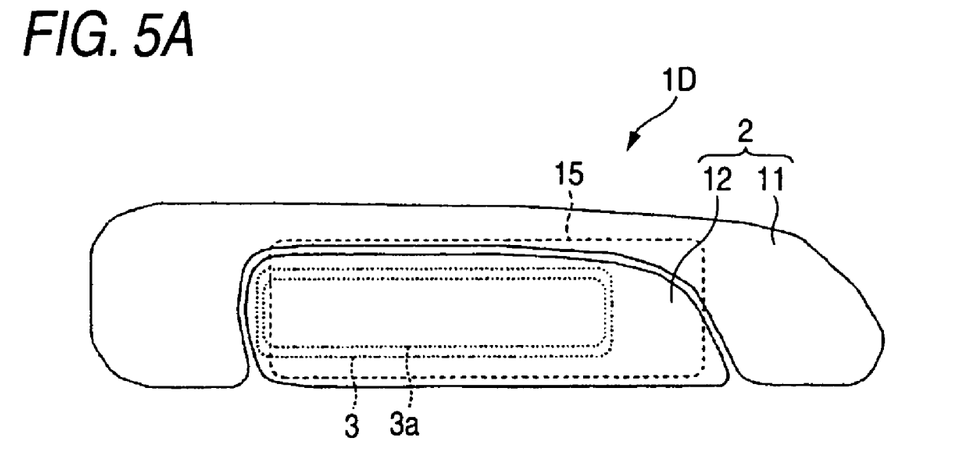
FIG. 5A is a diagram showing the front side of the door handle (fifth embodiment)
Figure 5B:
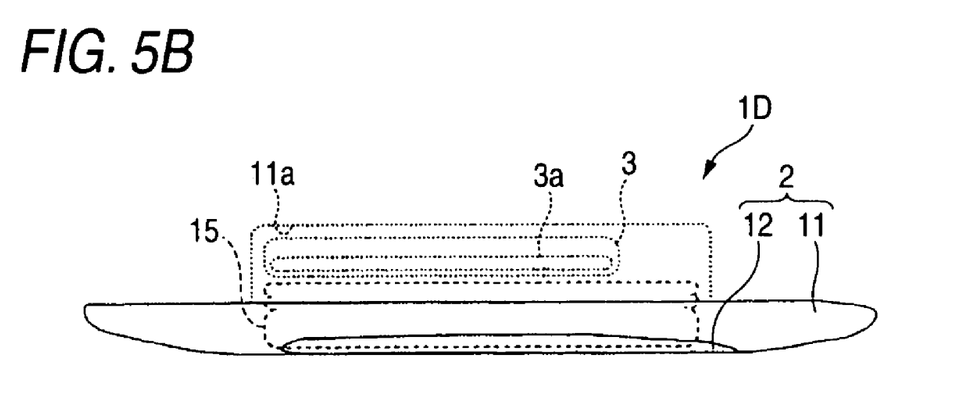
FIG. 5B is a plan view showing the upper surface side of the door handle (fifth embodiment).
Figure 6A:
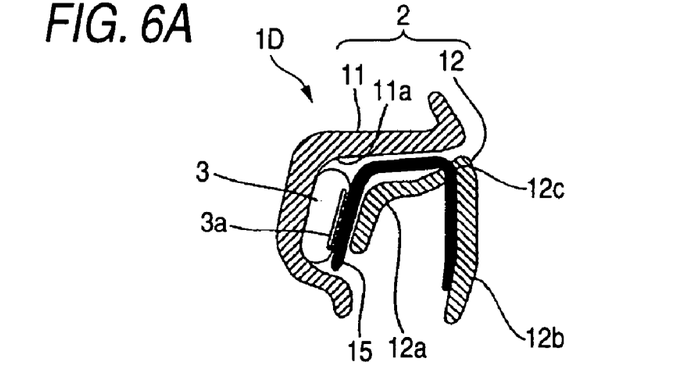
FIG. 6A is a longitudinally-sectional view showing the internal construction of the door handle (fifth embodiment)

FIG. 5A is a diagram showing the front side of a door handle 1D of this embodiment (is a perspective view of the sensor body 3, etc.), FIG. 5B is a plan view showing the upper surface side of the door handle 1D (is a perspective view of the sensor body 3, etc.), and FIG. 6A is a longitudinally-sectional view showing the internal construction of the door handle 1D of this embodiment.

In this embodiment, as shown in FIG. 6A, a sheet-shaped electric conductor 15 is disposed in the positional range extending from the gap between the detection face of the sensor body 3 and the rear side plate portion 12a to the inner surface of the front side plate portion 12b of the handle flap 12, and both the connecting electric conductor and the electrically conductive face are constructed by the electric conductor 15 as in the case of the handle 1A of the second embodiment (FIG. 2B). However, in this embodiment, an opening 12c (through hole) through which the electric conductor 15 is inserted is formed at the upper end portion of the rear side plate portion 12a of the handle flap 12, and the electric conductor 15 is disposed from the upper side of the handle flap 12 through the opening 12c to the inside (the inner surface of the front side plate portion 12b). This embodiment can also achieve the same effect as the second embodiment. However, there is a disadvantage that the opening 12c is provided.

Sixth Embodiment

Next, a sixth embodiment will be described. This embodiment is another embodiment of the flap type door handle (outer handle) (a modification of the fifth embodiment).

Figure 6B:
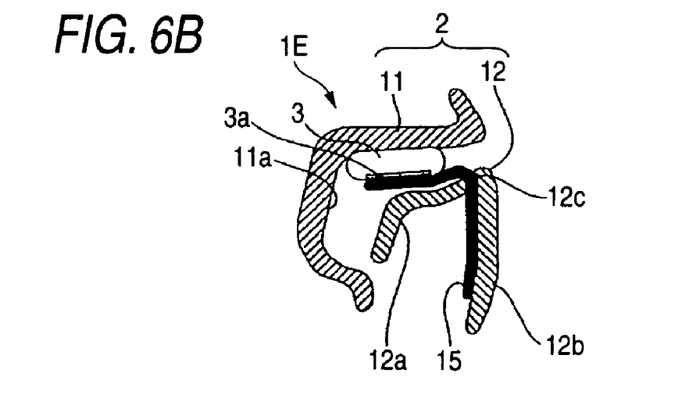
FIG. 6B is a longitudinally-sectional view showing the internal construction of the door handle (sixth embodiment)

FIG. 6B is a longitudinally-sectional view showing the internal construction of the door handle 1E of this embodiment.

In this embodiment, as shown in FIG. 6B, the sensor body 3 is fixed to the inner surface of the upper side (the upper side of the rear side plating portion 12a) of the recess portion 11a of the handle base portion 11, and the detection face is oriented substantially in the downward direction in order to detect the user's hand inserted to the inside of the handle flap 12. The electric conductor 15 is shortened in length in section by the amount corresponding to the change of the arrangement of the sensor body 3. The other construction is the same as the fifth embodiment. This embodiment can also achieve the same effect as the second embodiment, and also there is an advantage that the electric conductor 15 may be designed in a small size.

Seventh Embodiment

Figure 6C:
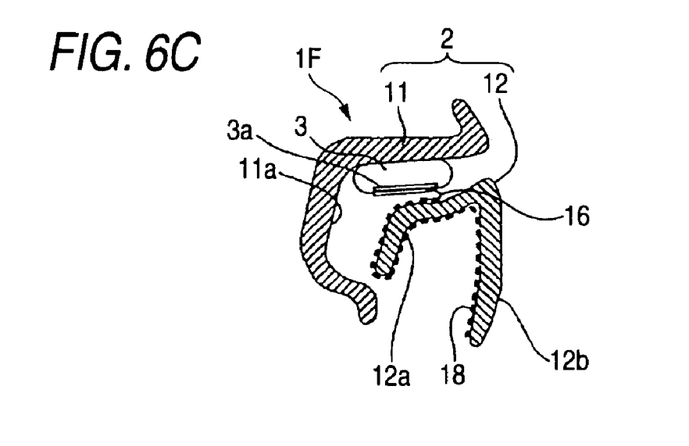
FIG. 6C is a longitudinally-sectional view showing the internal construction of the door hand (seventh embodiment).

Next, a seventh embodiment will be described. This embodiment is another embodiment of the flap type door handle (outer hand) (a modification of the fourth embodiment). FIG. 6C is a longitudinally-sectional view showing the internal construction of a door handle 1F of this embodiment. In this embodiment, as shown in FIG. 6C, the sensor body is fixed to the inner surface of the upper side (the upper side of the rear side plate portion 12a) of the recess portion 11a of the handle base portion 11, and the detection face is oriented substantially in the downward direction in order to detect the user's hand inserted to the inside of the handle flap 12. The electrically conductive face 18 is increased in length in section by the amount corresponding to the change of the arrangement of the sensor body 3. The other construction is the same as the fourth embodiment (FIG. 3B). This embodiment can also achieve the same effect as the fourth embodiment.

The present invention is not limited to the above embodiments, and various modifications and applications may be made.

For example, the balance adjustment of the detection sensitivity by trimming is not necessarily carried out uniformly over the whole detection range. This is because there is a case where some deviation (directivity) is positively provided to the detection sensitivity in accordance with some applied equipment.

Furthermore, the shape of the handle and the detailed arrangement positions of the sensor body or the electrical conductor and the electrically conductive face are not limited to the above embodiments.

In the above embodiments, the present invention (electrostatic capacitance sensor) is applied to the door handle of the vehicle. However, the present invention may be applied to parts other than the door handle insofar as they are required to be provided with the electrostatic capacitance sensor, and also the present invention may be applied to systems or equipment other than the vehicle.

What is claimed is:

1. An electrostatic capacitance sensor comprising
a sensor body and
a detection electrode provided to the sensor body,
the electrostatic capacitance sensor detecting an approach to a predetermined detection range of a dielectric material based on variation of floated capacitance formed by the detection electrode, wherein:
a detection face of the sensor body is oriented to face the detection range, and
an electrically conductive face is provided so as to cover the detection range, and
a connecting electric conductor for electromagnetically coupling the electrically conductive face and the detection electrode at least at the detection time, wherein the electrically conductive face functions as an extension of the detection electrode out of the sensor body;
wherein at least one of the connecting electric conductor and the electrically conductive face is subjected to trimming by creating a cut-out or the like for adjusting the detection sensitivity with respect to position.

2. The electrostatic capacitance sensor according to claim 1, wherein the electrically conductive face is constructed by forming an electrically conductive layer on the surface of a member covering the detection range.

3. The electrostatic capacitance sensor according to claim 1, wherein the electrically conductive face is formed on the surface of a resin member covering the detection range by resin molding.

4. The electrostatic capacitance sensor according to claim 1, wherein the electrically conductive face is constructed by an electrically conductive member disposed so as to cover the detection range.

5. The electrostatic capacitance sensor according to claim 4, wherein the electrically conductive member is integral with the connecting electric conductor.

6. A flap type handle with an electrostatic capacitance sensor comprising
a flap type handle body including a hand flap constructed so that a human hand is inserted to the inner surface side thereof and operated to pull the hand flap,
the hand flap being fixed to a handle base portion so as to be operable in the pull direction, the handle base portion being fixed to a door; and
the handle body being equipped with a sensor body of the electrostatic capacitance sensor for detecting approach of a dielectric material on the basis of variation of floated capacitance constructed by a detection electrode provided to the sensor body to detect the human hand, wherein:
the sensor body is secured to the handle base portion,
the detection face of the sensor body is oriented to face a predetermined detection range at the inner surface side of the handle flap,
an electrically conductive face is provided to the inner surface of the handle flap so as to cover the detection range, and
a connecting electric conductor for electromagnetically coupling the electrically conductive face and the detection electrode at least at the detection time, wherein the electrically conductive face functions as an extension of the detection electrode out of the sensor body;
wherein at least one of the connecting electric conductor and the electrically conductive face is subjected to trimming by creating a cut-out or the like for adjusting the detection sensitivity with respect to position.

7. The flap type handle with the electrostatic capacitance sensor according to claim 6, wherein the connecting electric conductor is set to a conduction state (contact state or the like) to the electrically conductive face, and
at least a part thereof is disposed so as to be overlapped and confronted to the detection electrode, whereby the electrically conductive face and the detection electrode are electromagnetically coupled to each other.

8. The flap type handle with the electrostatic capacitance sensor according to claim 6, wherein the connecting electric conductor is formed of a material having such a characteristic as to have elasticity or plasticity and be deformed in accordance with the shape of a bonded face and brought into close contact with the bonded face, and the connecting electric conductor is pinched between the detection face of the sensor body and the handle flap under the non-operation of the handle flap.

9. The flap type handle with the electrostatic capacitance sensor according to claim 7, wherein the connecting electric conductor is formed of a material having such a characteristic as to have elasticity or plasticity and be deformed in accordance with the shape of the bonded face and brought into close contact with the bonded face, and the connecting electric conductor is pinched between the detection face of the sensor body and the handle flap under the non-operation of the handle flap.

* * * * *